(12) United States Patent
Lin

(10) Patent No.: US 7,029,802 B2
(45) Date of Patent: Apr. 18, 2006

(54) EMBEDDED BI-LAYER STRUCTURE FOR ATTENUATED PHASE SHIFTING MASK

(75) Inventor: Cheng-ming Lin, Yunlin (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 186 days.

(21) Appl. No.: 10/462,359

(22) Filed: Jun. 16, 2003

(65) Prior Publication Data

US 2004/0253523 A1 Dec. 16, 2004

(51) Int. Cl.
*G03F 9/00* (2006.01)

(52) U.S. Cl. .......................................................... 430/5

(58) Field of Classification Search ..................... 430/5
See application file for complete search history.

(56) References Cited

U.S. PATENT DOCUMENTS 5,914,202 A * 6/1999 Nguyen et al. ................ 430/5

* cited by examiner

*Primary Examiner*—Christopher G. Young
(74) *Attorney, Agent, or Firm*—Duane Morris LLP

(57) ABSTRACT

An embedded bi-layer structure for an attenuated phase-shifting mask comprises an inner layer with lower transmittance, formed on a substrate; and an outer layer, formed on the inner layer, with higher transmittance and being more chemically stable than the inner layer. A method of forming such an embedded bi-layer structure is provided.

19 Claims, 2 Drawing Sheets

EMBEDDED BI-LAYER STRUCTURE FOR ATTENUATED PHASE SHIFTING MASK

FIELD OF THE INVENTION

The present invention relates to integrated circuit fabrication and more particularly to a photolithography apparatus usable in connection therewith.

BACKGROUND

In the semiconductor industry, there is a continuing effort to increase device density by scaling device size. Conventionally, to form an integrated circuit, a photoresist layer is formed on a wafer and is exposed to radiation through a photomask ("mask"). A mask typically comprises a substantially transparent base material such as quartz with an opaque layer having the desired pattern formed thereon. For example, chrome has long been used to make the opaque layer. When device features are reduced to a dimension below 1 micro level, diffraction effects become significant. The blending of two diffraction patterns associated with features which are close to each other has an adverse effect on resolution. As a result, portions of the photoresist layer underlying the opaque layer near the edges of features will be exposed.

To minimize effects of diffraction, phase shifting masks have been used. Typically, a phase shifting mask has a pattern in the opaque layer for transmitting exploring radiation which corresponds to the pattern to be formed on the underlying photoresist. Phase-shifters, which transmit the exposing radiation and shift the phase of the radiation approximately 180 degrees, are added to reduce diffraction effects. Alternate aperture phase shifting masks are formed by adding phase-shifters over every other opening. In rim phase shifting masks, phase-shifters are added along or near the outer edges of features. The radiation transmitted through the phase-shifter destructively interferes with radiation from the opening, thereby reducing the intensity of radiation incident on the photoresist surface underlying the opaque layer near a feature edge to improve image resolution.

Such phase shifting masks, however, have limitations on their ability to pattern some features and are difficult to fabricate. When two features such as two thin lines are placed in close proximity to each other in rim phase shifting masks, it is difficult to clearly form such features on the substrate because merger of associated phase-shifters causes over exposure to the region of photoresist between them. Further, phase-shifters may be fabricated by a separate step from the formation of the pattern on the opaque layer. To improve resolution by destructive interference, the locations of the phase-shifters must be precisely correlated with the pattern on the opaque layer. For very small features, the alignment tolerance between the opaque layer with pattern and phase-shifters may exceed the capability of the process.

To resolve these problems, an attenuated phase-shifted mask ("AttPSM") has been proposed. The AttPSM replaces the opaque layer (which is typically a layer of chrome about 0.1µ thick) with a "leaky" layer which transmits a reduced percentage of the incident radiation. For example, a very thin layer of chrome (approximately 300 angstroms) with approximately 10% transmittance could be used as the leaky layer. In addition, the leaky chrome layer shifts the phase of the transmitted radiation by a certain number of degrees, for example approximately 30 degrees, depending on the thickness and refractive index of the layer. To achieve the required 180 degrees phase shift between radiation transmitted through regions covered by the leaky chrome layer and regions of features, the features are also phase shifted a complementary angle by etching the mask or by placing a phase-shifting material in the regions of features.

Nonetheless, it is extremely difficult to deposit a thin layer of chrome with uniform thickness across the surface of the mask. Furthermore, physical characteristics such as refractive index fluctuate across the surface of the leaky chrome layer on the mask. The leaky chrome layer itself can not shift the phase of incident radiation 180 degrees. Additional processes needed to achieve this goal increase manufacturing cost and complexity.

To overcome these difficulties, an embedded coating material which integrates the property of obtaining the required phase shift—180 degrees—into the substrate coating layer which transmits a reduced percentage of the incident radiation, has been used. An embedded coating material such as molybdenum silicide ($MoSiO_xN_y$) is used to achieve AttPSM. However, molybdenum silicide only provides a low transmittance of about 8 percent. An embedded material which can attain high transmittance and is chemically stable under repeated use in the DUV exposure environment is needed.

SUMMARY OF THE INVENTION

An embedded bi-layer structure for an attenuated phase-shifting mask comprises an inner layer with a first transmittance, formed above a substrate; and an outer layer, formed on the inner layer, with a second transmittance higher than the first transmittance and being more chemically stable than the inner layer. A method of forming such an embedded bi-layer structure is provided.

BRIEF DESCRIPTION OF THE DRAWINGS

A more complete understanding of the present invention can be obtained by reference to the detailed description of embodiments in conjunction with the accompanying drawing, in which.

DETAILED DESCRIPTION

Figure 1:
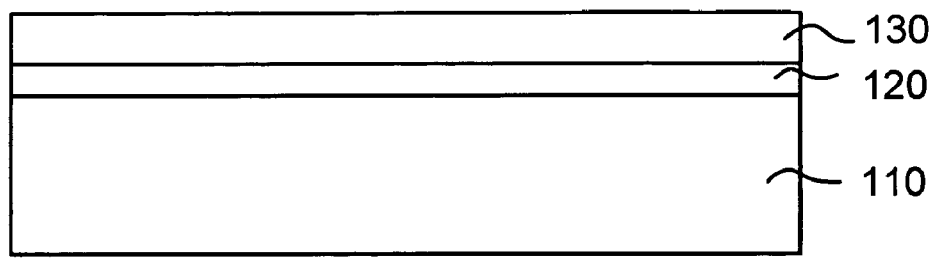
FIG. 1 illustrates a cross section view of an embedded bi-layer structure for AttPSM.

This description of the exemplary embodiments is intended to be read in connection with the accompanying drawings, which are to be considered part of the entire written description. In the description, relative terms such as "lower," "higher," "more," and "enough" should be construed to refer to the quality or quantity of the characteristic under discussion. Relative terms such as "inner," "outer," "above," "below," "up," "down," "top" and "bottom" should be construed to refer to the orientation as then described or as shown in the drawing under discussion. These relative terms are for convenience of description and do not require that the apparatus be constructed or operated in a particular orientation. The term "transmittance" defines the intensity of the radiation transmitted through a material over that of the incident radiation in percentage. The term "chemical stability" defines the inert characteristic of a material to avoid chemical reactions with other materials.

As shown in FIG. 1, an exemplary embodiment 100 comprises a substrate 110, an inner layer 120, having a predetermined transmittance, is disposed on the substrate 110. An outer layer 130, having a higher transmittance and being more chemically stable than the inner layer, is disposed on the inner layer 120. In some embodiments, the substrate 110 can be quartz. The inner layer 120 can be a composition of, for example, aluminum, silicon, and oxygen ($AlSi_{x1}O_{y1}$); aluminum, silicon, and nitrogen ($AlSi_{x1}N_{y1}$); or aluminum, silicon, oxygen, and nitrogen ($AlSi_{x1}O_{y1}N_{z1}$). The outer layer 130 can also be a composition of, for example, aluminum, silicon, and oxygen ($AlSi_{x2}O_{y2}$); aluminum, silicon, and nitrogen ($AlSi_{x2}N_{y2}$); or aluminum, silicon, oxygen, and nitrogen ($AlSi_{x2}O_{y2}N_{z2}$). The outer layer 130 need not have the same composition of elements as the inner layer 120. However, the outer layer 130 is more saturated with oxygen, nitrogen, or both oxygen and nitrogen to achieve higher transmittance and be more chemically stable than the inner layer 120. In some embodiments, the total transmittance of the inner layer 120 and the outer layer 130 ranges from 15% to 85%. In some other embodiments, the total phase shift of incident radiation of the inner layer 120 and the outer layer 130 is approximately 180 degrees.

The total transmittance (Tt) of the bi-layer structure is the product of the individual transmittance of the inner layer 120 (Ti) multiplied by the individual transmittance of the outer layer 130 (To). The individual transmittance (T) of the inner layer 120 and the outer layer 130 is determined by the extinction coefficient (k) which is a measure of the rate of diminution of transmitted light via scattering and absorption for a medium, the thickness (d) of the layer, and the wavelength (w) of incident radiation as shown in the following formula:

$$T = A\exp(-4\pi dk/w) \text{ and } Tt = Ti \cdot To$$

A is a constant. In some embodiments, the extinction coefficient of the inner layer 120 ranges approximately from 0.28 to 0.42; and the extinction coefficient of the outer layer 130 ranges approximately from 0.12 to 0.29. The total transmittance is also associated with the wave length of the incident radiation employed during the photolithographic processing. For example, deep ultra-violet (DUV) radiation with wave length of 193 nm can be used. Accordingly, people with ordinary skill in the art can adjust those factors such as the thickness and the extinction coefficient of the inner layer 120 and the outer layer 130 to obtain the desired total transmittance of the bi-layer structure which can range approximately from 15% to 85%.

Similarly, the total phase shift (Pt) is the addition of the individual phase shift of the inner layer 120 (Pi) and the outer layer 130 (Po). The individual phase shift (P) is determined by the refractive index (n) of the layer material, its thickness (d), and the wave length (w) of the incident radiation as shown in the following formula:

$$P = 360(n-1)d/w \text{ and } Pt = Pi + Po$$

In some embodiments, the refractive index of the inner layer 120 ranges approximately from 1.8 to 2.35; and the refractive index of the outer layer 130 ranges approximately from 2.03 to 2.46. Various radiation sources can be used during the photolithographic processing such as deep ultraviolet radiation (DUV) with wavelength of 193 nm. Through appropriate arrangement, the desired phase shift, for example 180 degrees, can be attained accordingly.

Figure 2:
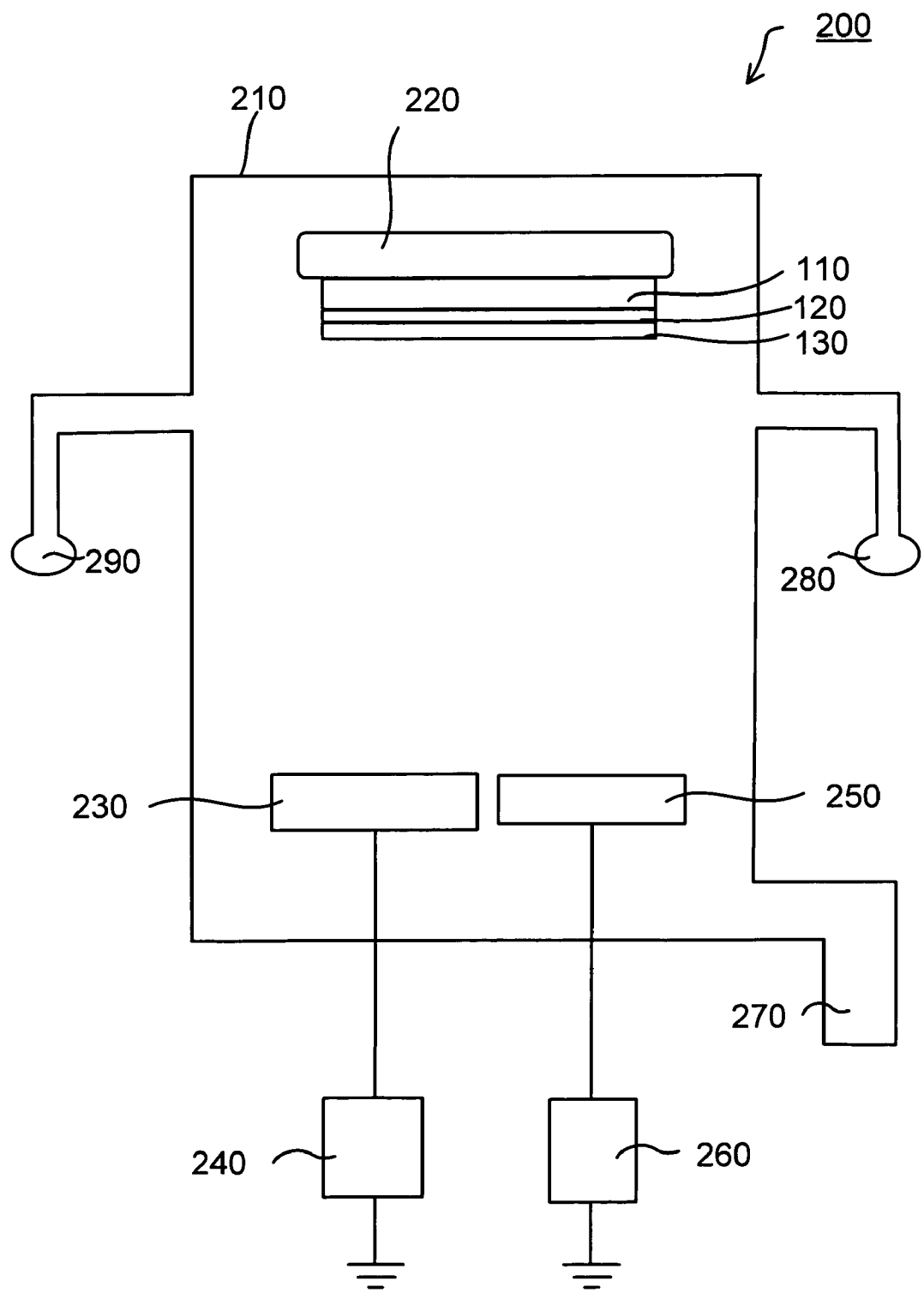
FIG. 2 schematically illustrates a sputtering system to fabricate an embedded bi-layer structure for AttPSM.

Either physical vapor deposition (PVD) or chemical vapor deposition (CVD) can be used to fabricate the inner layer 120 and the outer layer 130. In some embodiments as shown in FIG. 2, a sputtering system 200, a typical PVD method, is employed. A substrate 110 such as quartz is attached to the mask holder 220. In an exemplary embodiment, an inner layer 120 comprising aluminum, silicon, and nitrogen ($AlSi_{x1}N_{y1}$), is deposited by sputtering. Aluminum target 230 is connected to a negative potential (electrically grounded) with an anode (not shown) present in the chamber 210, provided by direct current supply 240 with the power from about 130 to about 186 Watts. A silicon target 250 is connected to the negative side of a radio frequency (RF) generator 260 with a power from about 70 to about 100 Watts. A vacuum pump 260 is used to maintain the pressure inside the chamber 210 at approximately $10^{-2}$ to $10^{-3}$ mtorr. Argon gas flow rate is from about 80 to about 90 standard cubic centimeter per minute (sccm). Nitrogen gas flow rate ranges from about 1.5 to about 6.0 sccm.

During the course of sputtering, argon gas is introduced into the chamber 210 and is ionized to a positive charge. The positively charged argon atoms are attracted to and accelerate toward aluminum target 230 and silicon target 250. When the positively charged argon atoms strike the targets, aluminum and silicon atoms are knocked off from the target and sputtered into the chamber 210. Some of the sputtered atoms come to rest on the substrate 110 and the inner layer 120 is deposited. The deposition rate is about 0.3 to 1.2 nm per minute.

The inner layer 120, which comprises $AlSi_{x1}N_{y1}$, in one embodiment, has x1 ranging from 0.28 to 0.45 and y1 ranging from 0.48 to 0.66. In such embodiment, the refractive index of inner layer 120 ranges from 1.8 to 2.35 and the extinction coefficient ranges from 0.28 to 0.42, resulting in the individual transmittance ranges from 5% to 45%. The predetermined refractive index and extinction coefficient can be obtained through adjusting the power supply of the direct current for the aluminum target and the power supply of the RF generator for the silicon target and controlling the flow rate of argon gas and nitrogen gas. Taking the thickness of the inner layer 120 into consideration, the desired individual transmittance and phase shift can then be achieved.

In other exemplary embodiments, an outer layer 130 comprising aluminum, silicon, and nitrogen ($AlSi_{x2}N_{y2}$), is deposited by sputtering. Aluminum target 230 is connected to a negative potential (electrically grounded) with an anode (not shown) present in the chamber 210, provided by direct current supply 240 with the power from about 130 to about 186 Watts. Silicon target 250 is connected to the negative side of a radio frequency generator 260 with a power ranging from about 60 to about 80 Watts. A vacuum pump 260 is used to maintain the pressure inside the chamber 210 at approximately $10^{-2}$ to $10^{-3}$ mtorr. Argon gas flow rate ranges from about 75 to 100 standard cubic centimeter per minute (sccm). Nitrogen gas flow rate ranges from about 1.5 to 6.0 sccm. Through the aforementioned process, the outer layer 130 is deposited on the inner layer 120. The deposition rate was about 0.3 to 1.2 nm per minute.

The outer layer 130, which comprises $AlSi_{x2}N_{y2}$, in one embodiment, has x2 ranging from 0.21 to 0.47 and y2 ranging from 1.08 to 1.45. In such embodiment, the refractive index of outer layer 130 ranges from 2.03 to 2.46 and the extinction coefficient ranges from 0.12 to 0.29, resulting in the individual transmittance ranges from 20% to 90%. The predetermined refractive index and extinction coefficient can be obtained through adjusting the power supply of the direct current for the aluminum target and the power supply of the RF generator for the silicon target, and controlling the flow rate of argon gas and nitrogen gas. Taking the thickness of the inner layer 120 into consideration, the desired individual transmittance and phase shift can then be achieved.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. An embedded bi-layer structure for an attenuated phase-shifting mask, comprising:
    an inner layer with a first transmittance, formed above a substrate; and
    an outer layer, formed on said inner layer, with a second transmittance higher than said first transmittance and being more chemically stable than said inner layer.

2. The embedded bi-layer structure of claim 1 wherein said substrate comprises quartz.

3. The embedded bi-layer structure of claim 1 wherein said inner layer comprises a material containing aluminum, silicon, and at least one of the group consisting of oxygen and nitrogen.

4. The embedded bi-layer structure of claim 1 wherein said outer layer comprises a material containing aluminum, silicon, and at least one of the group consisting of oxygen and nitrogen.

5. The embedded bi-layer structure of claim 1 wherein:
    said inner layer comprises a material containing aluminum, silicon, and at least one of the group consisting of oxygen and nitrogen; and
    said outer layer comprises a material containing aluminum, silicon, and sufficiently saturated with at least one of the group consisting of oxygen and nitrogen, to obtain higher transmittance and higher chemical stability than said inner layer.

6. The embedded bi-layer structure of claim 1 wherein the refractive index of said inner layer ranges approximately from 1.8 to 2.35.

7. The embedded bi-layer structure of claim 1 wherein the refractive index of said outer layer ranges approximately from 2.03 to 2.46.

8. The embedded bi-layer structure of claim 1 wherein the extinction coefficient of said inner layer ranges approximately from 0.28 to 0.42.

9. The embedded bi-layer structure of claim 1 wherein the extinction coefficient of said outer layer ranges approximately from 0.12 to 0.29.

10. The embedded bi-layer structure of claim 1 wherein the total transmittance of said inner layer and said outer layer ranges from 15% to 85%.

11. The embedded bi-layer structure of claim 1 wherein the total phase shift of said inner layer and said outer layer is approximately 180 degrees.

12. The embedded bi-layer structure of claim 1 wherein the total transmittance of said inner layer and said outer layer ranges from 15% to 85% and the total phase shift of said inner layer and said outer layer is approximately 180 degrees.

13. The embedded bi-layer structure of claim 1 wherein:
    said inner layer comprises a material containing aluminum, silicon, and at least one of the group consisting of oxygen and nitrogen;
    said outer layer comprises a material containing aluminum, silicon, and sufficiently saturated with at least one of the group consisting of oxygen and nitrogen, to obtain higher transmittance and higher chemical stability than said inner layer;
    the total transmittance of said inner layer and said outer layer ranges from 15% to 85%; and
    the total phase shift of said inner layer and said outer layer is approximately 180 degrees.

14. The embedded bi-layer structure of claim 1 wherein:
    a predetermined pattern is formed on said embedded bi-layer structure.

15. A method of forming an embedded bi-layer structure for an attenuated phase-shifting mask, comprising:
    forming an inner layer above a substrate; and
    forming an outer layer on said inner layer, sufficiently saturated with at least one of the group consisting of oxygen and nitrogen, to obtain higher transmittance and more chemical stability than said inner layer.

16. The method of claim 15 wherein said inner layer and said outer layer are formed by plasma enhanced chemical vapor deposition (PECVD).

17. The method of claim 15 wherein said inner layer and said outer layer are formed by PECVD with a nitrogen gas flow rate ranging approximately from 1.5 to 6.0 sccm.

18. The method of claim 15 wherein said inner layer and said outer layer are formed by PECVD with a pressure ranging approximately from $10^{-2}$ to $10^{-3}$ mtorr.

19. The method of claim 15 wherein said inner layer and said outer layer are formed by PECVD with a power supply for aluminum target ranging approximately from 130 to 186 Watts.

* * * * *